United States Patent
Murakami et al.

[11] Patent Number: 6,125,074
[45] Date of Patent: Sep. 26, 2000

[54] SEMICONDUCTOR MEMORY DEVICE HAVING A SMALL MEMORY CELL DRIVING CIRCUIT

[75] Inventors: Nobuo Murakami; Kiyokazu Hashimoto, both of Tokyo, Japan

[73] Assignee: NEC Corporation, Tokyo, Japan

[21] Appl. No.: 08/855,889

[22] Filed: May 12, 1997

[30] Foreign Application Priority Data

May 13, 1996 [JP] Japan ................................. 8-142240

[51] Int. Cl.$^7$ ................................. G11C 8/08; G11C 8/10

[52] U.S. Cl. ................................. 365/230.06; 365/230.03; 365/185.23; 365/103; 365/104; 365/189.06; 365/189.11; 326/108; 326/106

[58] Field of Search ................... 365/230.06, 230.03, 365/185.23, 103, 104, 230.02, 189.06, 189.11; 326/106, 108, 107

[56] References Cited

U.S. PATENT DOCUMENTS

| | | | |
|---|---|---|---|
| 5,278,785 | 1/1994 | Hazani | 365/182 |
| 5,311,467 | 5/1994 | Lysinger et al. | 365/189.01 |
| 5,392,253 | 2/1995 | Atsumi et al. | 365/230.06 |
| 5,699,315 | 12/1997 | Ko | 365/230.03 |
| 5,808,500 | 9/1998 | Kalpakjian | 327/321 |
| 5,896,340 | 4/1999 | Wong et al. | 365/230.03 |
| 5,912,857 | 6/1999 | Kim et al. | 365/230.06 |

FOREIGN PATENT DOCUMENTS 8-255494  10/1996  Japan.

*Primary Examiner*—Andrew Q. Tran
*Attorney, Agent, or Firm*—Young & Thompson

[57] ABSTRACT

In a semiconductor memory device including memory cells, first and second decoders generate first and second selection signals, and a driver circuit generates a drive signal for driving the memory cells. The driver circuit includes a transfer gate, controlled by the first selection signal, thus passing the second selection signal to generate the drive signal.

3 Claims, 11 Drawing Sheets

SEMICONDUCTOR MEMORY DEVICE HAVING A SMALL MEMORY CELL DRIVING CIRCUIT

BACKGROUND OF THE INVENTION

1. Field of the Invention

The present invention relates to a semiconductor memory device, and more particularly, to an improvement of a driver circuit of a semiconductor memory device.

2. Description of the Related Art

Generally, in a prior art semiconductor memory device, a memory cell array is divided into a plurality of blocks. Each of the blocks is also divided into a plurality of memory cell columns. Each of the memory cell columns is further divided into a column switch transistor and a plurality of memory cells. Therefore, a block decoder is provided for selecting one of the blocks, a column decoder is provided for selecting one of the memory cell columns from each block, and a word decoder is provided for selecting one memory cell from each memory cell column.

Also, a column driver circuit is connected to the block decoder and the column decoder, thus generating column drive signals for the memory cell columns, and a word driver circuit is connected to the block decoder and the word decoder, thus generating word drive signals.

In the prior art driver circuits, however, the number of elements (transistors) is large or the size of each element is large, so that the total gate width of transistors of the driver circuits becomes large. This will be explained later in detail. Thus, the integration cannot be enhanced.

SUMMARY OF THE INVENTION

It is an object of the present invention to reduce the size of driver circuits in a semiconductor memory device.

According to the present invention, in a semiconductor memory device including memory cells, first and second decoders generate first and second selection signals, and a driver circuit generates a drive signal for driving the memory cells. The driver circuit includes a transfer gate, controlled by the first selection signal, thus passing the second selection signal to generate the drive signal.

BRIEF DESCRIPTION OF THE DRAWINGS

The present invention will be more clearly understood from the description as set forth below, as compared with the prior art with reference to the accompanying drawings, wherein.

DESCRIPTION OF THE PREFERRED EMBODIMENT

Before the description of the preferred embodiment, prior art ROM type semiconductor memory devices will be explained with reference to FIGS. 1 through 7.

Figure 1:
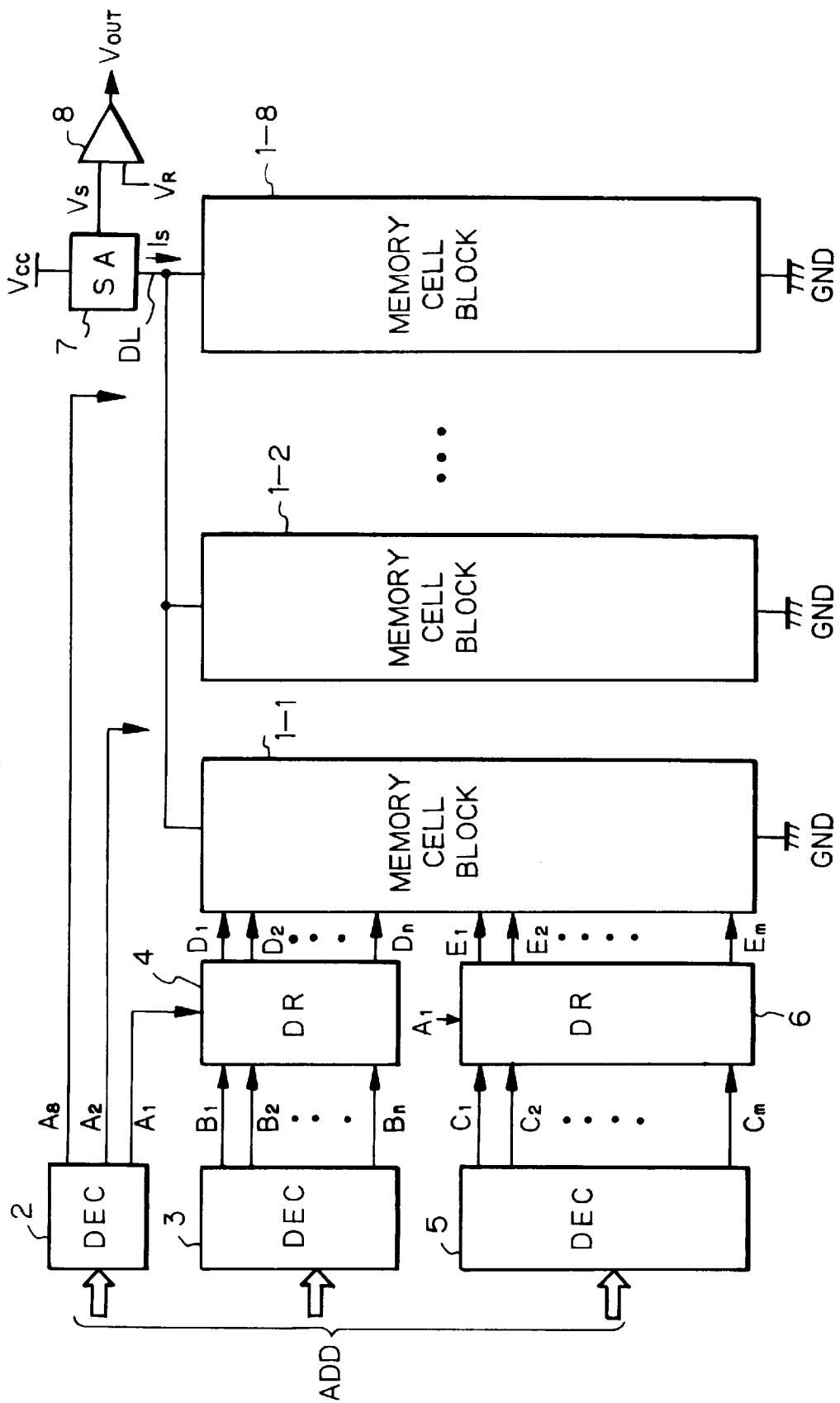
FIG. 1 is a block circuit diagram illustrating a first prior art ROM type semiconductor memory device.

In FIG. 1, which illustrates a first prior art ROM device, reference numerals 1-1, 1-2, . . . , 1-8 designate NAND type memory cell blocks. One of the memory cell blocks 1-1, 1-2, . . . , 1-8 is selected by a block decoder 2. Also, one memory cell of each of the memory cell blocks 1-1, 1-2, . . . , 1-8 is selected by a column decoder 3, a column driver circuit 4, a word decoder 5 and a word driver circuit 6. In this case, the block decoder 2, the column decoder 3 and the word decoder 5 receive an address signal ADD.

The memory cell blocks 1-1, 1-2, . . . , 1-8 are connected via a digit line DL to a sense amplifier 7. The sense amplifier 7 senses a sense current $I_S$ in accordance with a state of a selected memory cell, and generates a sense voltage $V_S$ and transmits it to a comparator 8. The comparator 8 compares the sense voltage $V_S$ with a reference voltage $V_R$, and generates an output voltage $V_{out}$.

Figure 2:
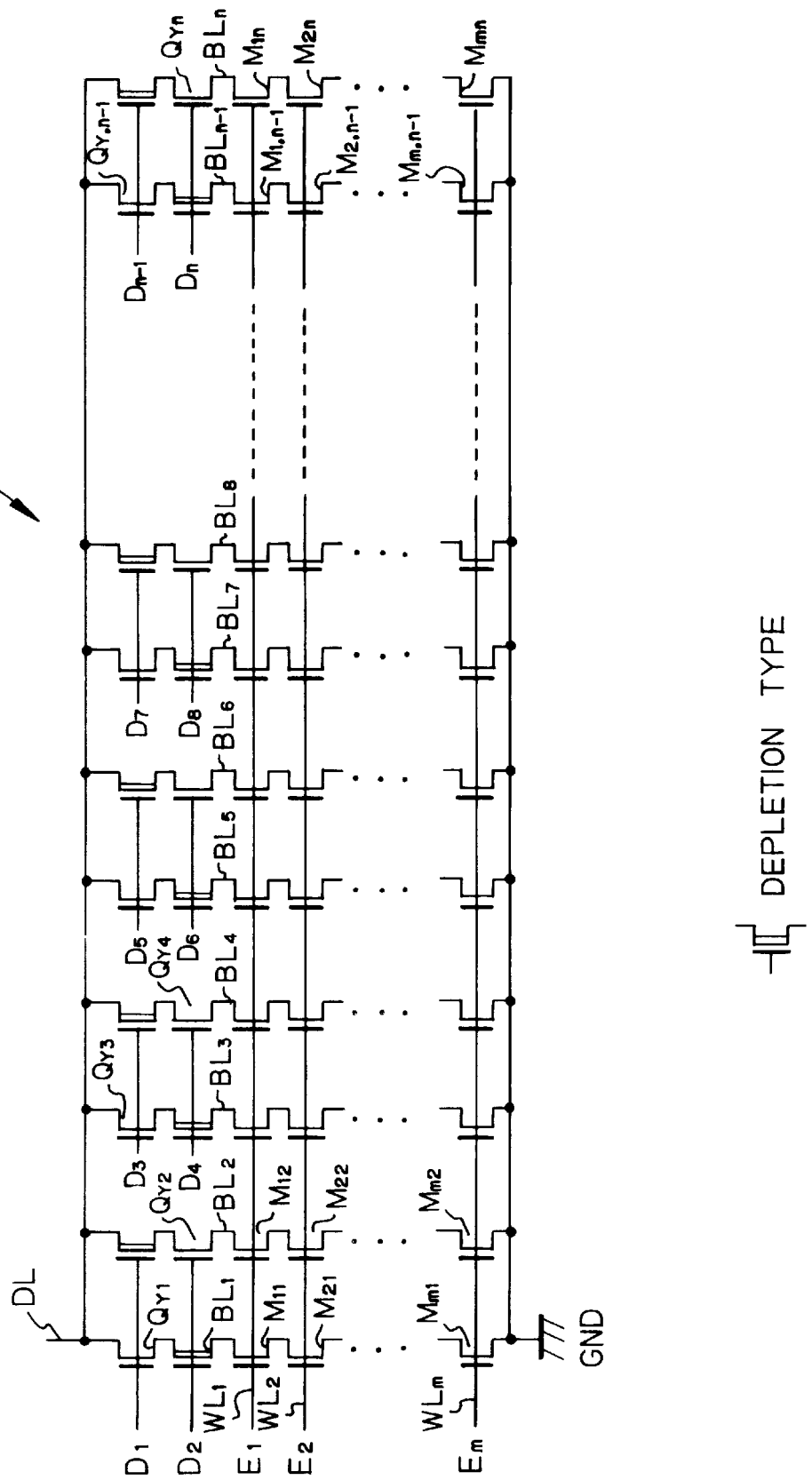
FIG. 2 is a detailed circuit diagram of the memory cell block of FIG. 1.

In FIG. 2, which is a detailed circuit diagram of the memory cell block 1-1 of FIG. 1, the memory cell block is formed by nonvolatile memory cells $M_{11}, M_{12}, \ldots, M_{mn}$. In this case, the memory cells $M_{11}, M_{21}, \ldots, M_{m1}$ are connected between a bit line $BL_1$ and a ground terminal GND; the memory cells $M_{12}, M_{22}, \ldots, M_{m2}$ are connected between a bit line $BL_2$ and the ground terminal GND; . . . ; and the memory cells $M_{1n}, M_{2n}, \ldots, M_{mn}$ are connected between a bit line $BL_n$ and the ground terminal GND. Also, the gates of the memory cells $M_{11}, M_{12}, \ldots, M_{1n}$ are connected to a word line $WL_1$; the gates of the memory cells $M_{21}, M_{22}, \ldots, M_{2n}$ are connected to a word line $WL_2$; . . . ; and the gates of the memory cells $M_{m1}, M_{m2}, \ldots, M_{mn}$ are connected to a word line $WL_m$.

The bit lines $BL_1, BL_2, \ldots, BL_n$ are connected via column selection transistors $Q_y1, Q_y2, \ldots, Q_yn$ as well as normally-ON state transistors (depletion type MOS transistors) to the digit line DL. One of the bit lines $BL_1, BL_2, \ldots, BL_n$ is selected by column drive signals $D_1, D_2, \ldots, D_n$ generated from the column driver circuit 4.

On the other hand, one of the word lines $WL_1, WL_2, \ldots, WL_n$ is selected by word drive signals $E_1, E_2, \ldots, E_m$ generated from the word driver circuit 6.

Figure 3:
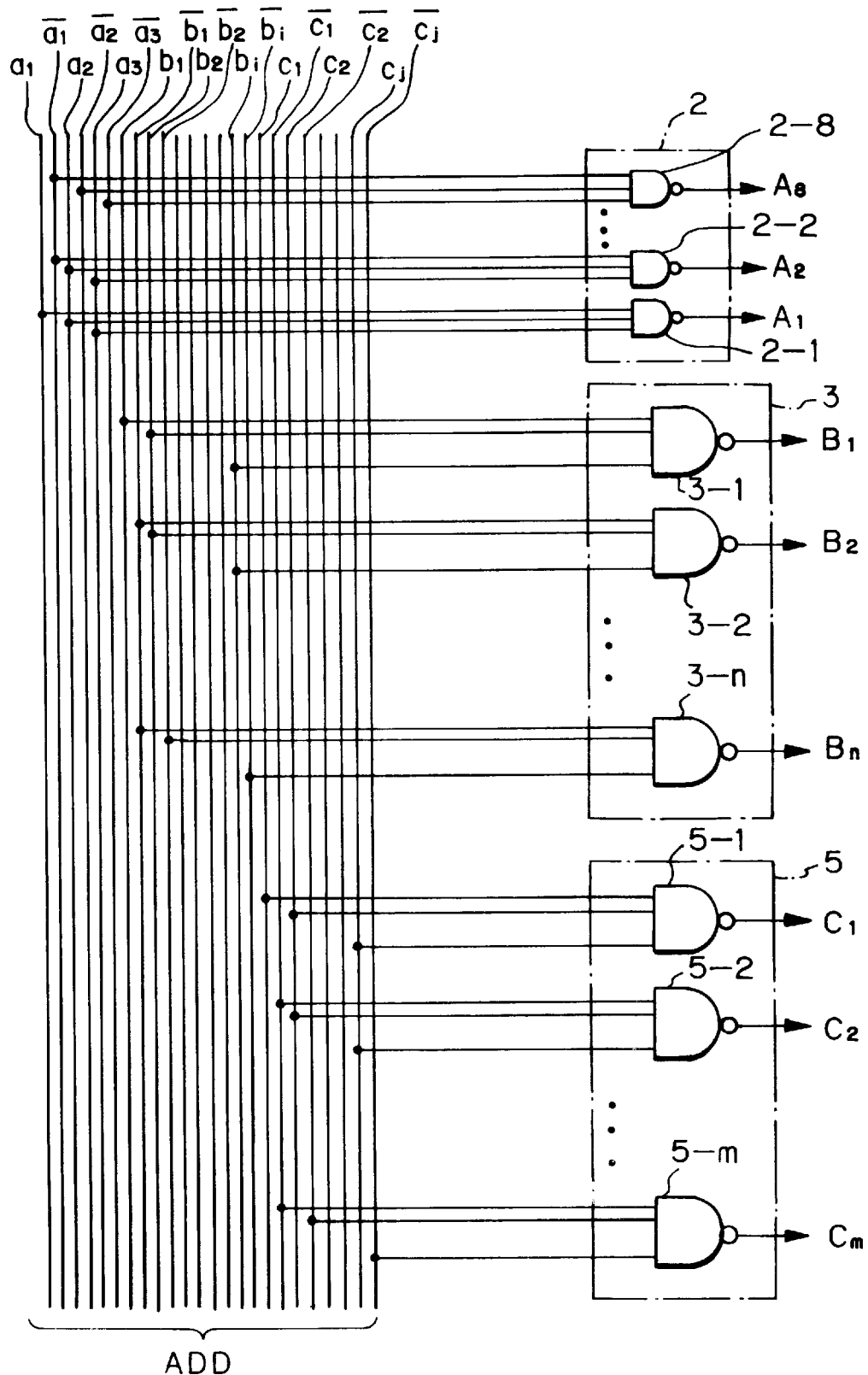
FIG. 3 is a detailed circuit diagram of the block decoder, the column decoder and the word decoder of FIG. 1.

In FIG. 3, which is a detailed circuit diagram of the block decoder 2, the column decoder 3 and the word decoder 5 of FIG. 1, the block decoder 2 receives address bits $a_1, \overline{a_1}, a_2, \overline{a_2}, a_3$ and $\overline{a_3}$ of the address signal ADD. The block decoder 2 is formed by NAND circuits 2-1, 2-2, . . . , 2-8 for generating block selection signals $A_1, A_2, \ldots, A_8$, respectively. For example, if at least one of the address bits $a_1, a_2$ and $a_3$ is high, the block selection signal $A_1$ is made high (inactive). On the other hand, if all of the address bits $a_1, a_2$ and $a_3$ are low, the block selection signal $A_1$ is made low (active). Also, the column decoder 3 receives address bits $b_1, \overline{b_1}, b_2, \overline{b_2}, \ldots, b_i$ and $\overline{b_i}$ of the address signal ADD. The column decoder 3 is formed by NAND circuits 3-1, 3-2, . . . , 3-n for generating column selection signals $B_1, B_2, \ldots, B_n$, respectively. For example, if at least one of the address bits $b_1, b_2, \ldots, b_i$ is high, the column selection signal $B_1$ is made high (inactive). On the other hand, if all of the address bits $b_1, b_2, \ldots, b_i$ are low, the column selection signal $B_1$ is made low (active). Also, the word decoder 5 receives address bits $c_1, \overline{c_1}, c_2, \overline{c_2}, \ldots, c_j$ and $\overline{c_j}$ of the address signal ADD. The word decoder 5 is formed by NAND circuits 5-1, 5-2, ..., 5-m for generating word selection signals $C_1, C_2, \ldots, C_m$, respectively. For example, if at least one of the address bits $c_1, c_2, \ldots, c_j$ is high, the word selection signal $C_1$ is made high (inactive). On the other hand, if all of the address bits $c_1, c_2, \ldots, c_j$ are low, the word selection signal $C_1$ is made low (active).

Figure 4:
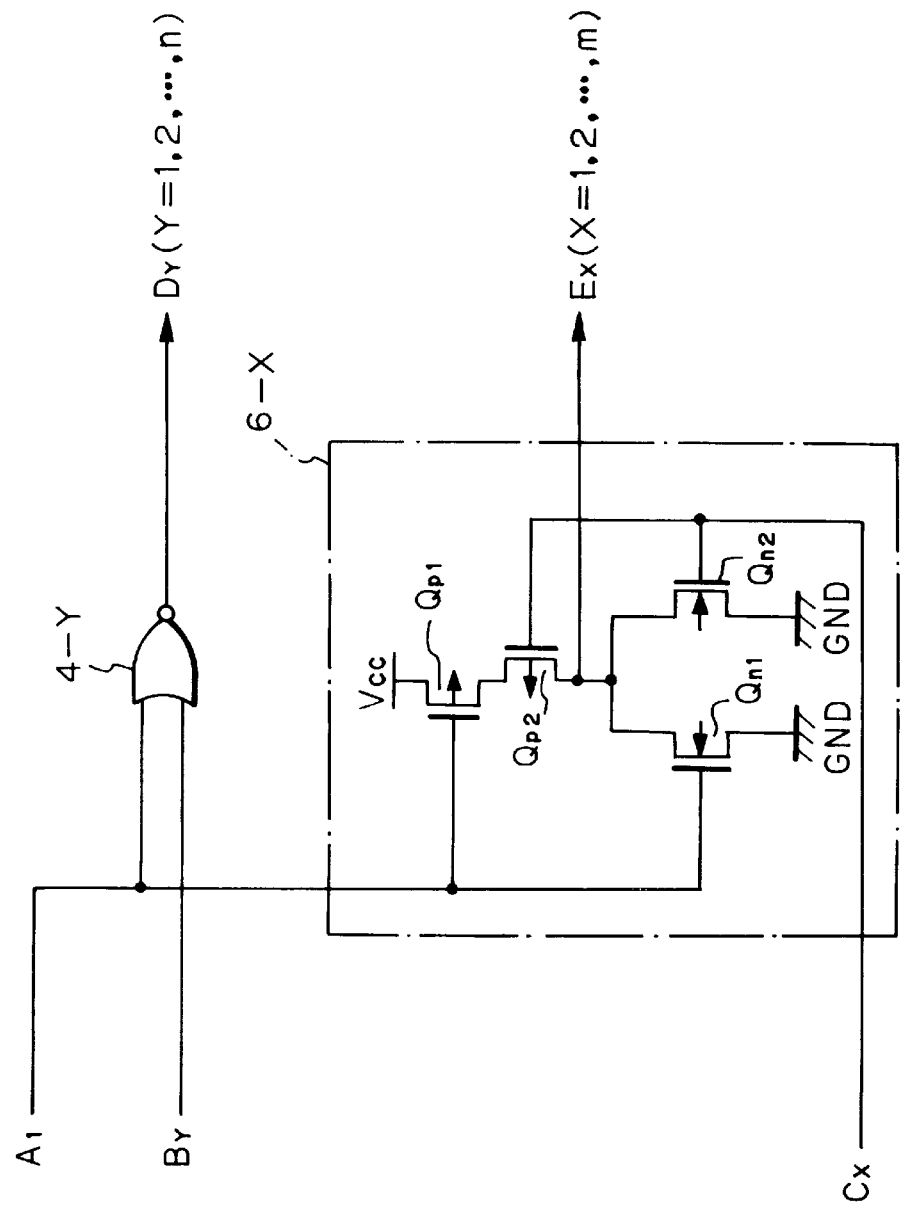
FIG. 4 is a detailed circuit diagram of the column driver circuit and the word driver circuit of FIG. 1.

FIG. 4 is a detailed circuit diagram of the column driver circuit 4, and the word driver circuit 6 of FIG. 1. In this case, only a driver 4-Y for generating a column drive signal $D_Y$ and a driver 6-X for generating a word drive signal $E_K$ are illustrated, and the other drivers are omitted for simplifying the description.

The driver 4-Y is formed by a two-input NOR circuit which receives the block selection signal $A_1$ and the column selection signal $B_Y$. On the other hand, the driver 6-X is also formed by a two-input NOR circuit including two P-channel MOS transistors $Q_p1$ and $Q_p2$ in series and two N-channel MOS transistors $Q_n1$ and $Q_n2$. Note that the NOR circuit of the driver 4-Y has the same configuration as that of the driver 6-X except for their sizes. That is, since each of the column drive signals $D_1, D_2, \ldots, D_n$ is used for driving only two transistors, the NOR circuit of the driver 4-Y can be reduced in size. On the other hand, since each of the word drive signals $E_1, E_2, \ldots, E_m$ is used for driving a large number of memory cells (transistors), the NOR circuit of the driver 6-X cannot be reduced in size. That is, the gate width of each of the transistors $Q_p1, Q_p2, Q_n1$ and $Q_n2$ of the driver 6-X has to be increased.

Figure 5:
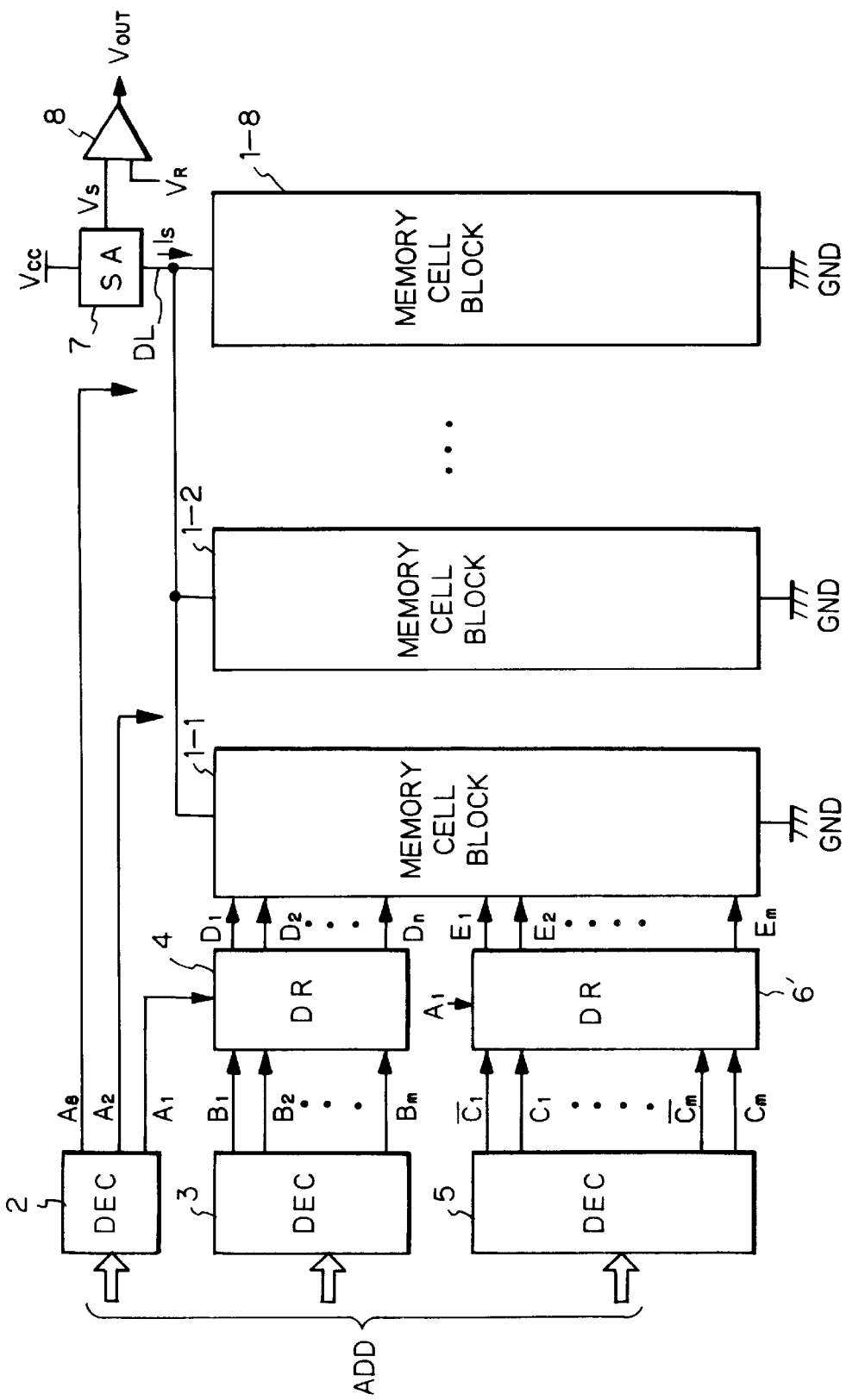
FIG. 5 is a block circuit diagram illustrating a second prior art ROM type semiconductor memory device.

In FIG. 5, which illustrates a second prior art ROM type semiconductor memory device, the word decoder 5 and the word driver circuit 6 of FIG. 1 are modified into a word decoder 5' and a word driver circuit 6', respectively.

Figure 6:
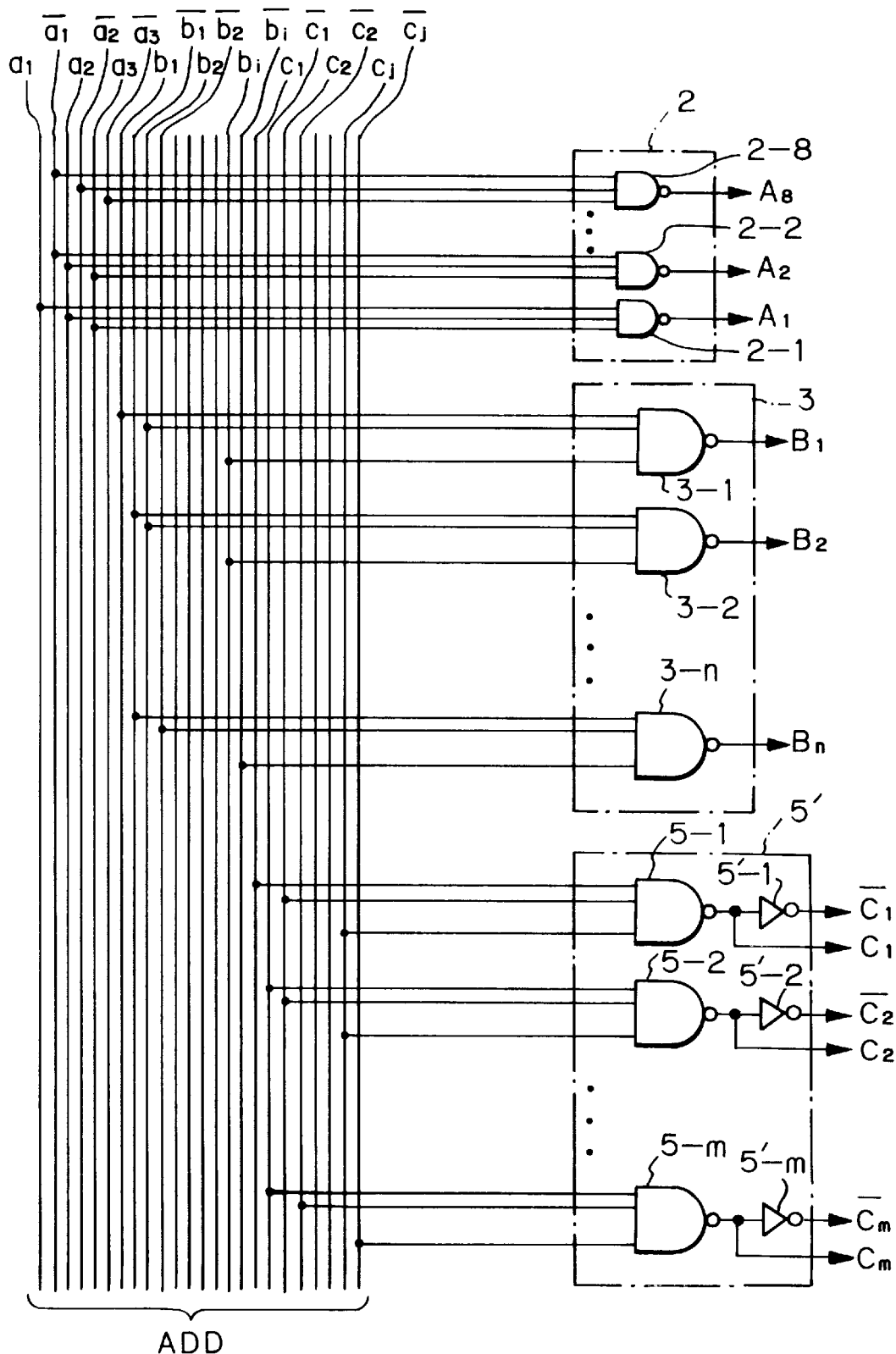
FIG. 6 is a detailed circuit diagram of the block decoder, the column decoder and the word decoder of FIG. 5.

As illustrated in FIG. 6, which is a detailed circuit diagram of the word decoder 5' of FIG. 5, the word decoder 5' includes inverters 5'-1, 5'-2, ..., 5'-m in addition to the NAND circuits 5-1, 5-2, ..., 5-m, so that inverted signals $\overline{C_1}, \overline{C_2}, \ldots, \overline{C_m}$ of the word selection signals $C_1, C_2, \ldots, C_m$ are generated in addition to the word selection signals $C_1, C_2, \ldots, C_m$.

Figure 7:
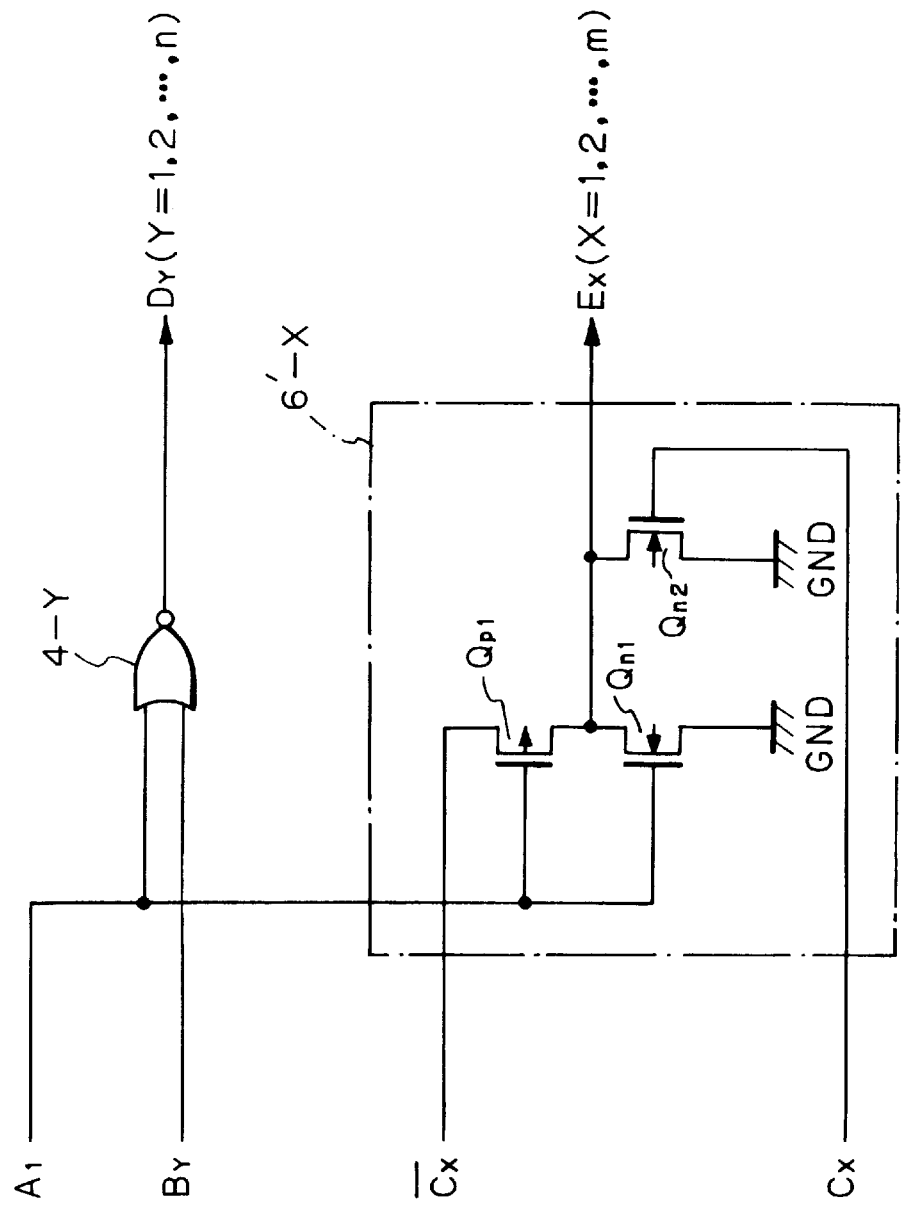
FIG. 7 is a detailed circuit diagram of the column driver circuit and the word driver circuit of FIG. 5.

Also, as illustrated in FIG. 7, which is a detailed circuit diagram of the word driver circuit 6' of FIG. 5, a driver 6'-X corresponding to the driver 6-X of FIG. 4, the P-channel transistor $Q_p2$ of FIG. 4 is deleted and the inverted signal $\overline{C_x}$ of the word selection signal $C_x$ is applied to the source of the P-channel MOS transistor $Q_p1$.

Thus, in the second prior art ROM device, although the inverted signal $\overline{C_x}$ of the word selection signal $C_x$ is required, the number of transistors in the word driver circuit 6' is smaller than that in the word driver circuit 6 of the first prior art ROM device, thus enhancing the integration.

The layout of the column driver circuit 4 and the word driver circuit 6' of FIGS. 5 and 7 is discussed below.

Generally, a drain current $I_d$ of a MOS transistor satisfies the following:

$$I_d \propto \mu W/L \tag{1}$$

where $\mu$ is a mobility of carriers such as electrons or holes; W is a gate width; and L is a gate length.

Also, $$\mu_p:\mu_n=1:2 \tag{2}$$

where $\mu_p$ is the mobility of holes and $\mu_n$ is the mobility of electrons.

Further, in an inverter formed by a P-channel MOS transistor and an N-channel MOS transistor, if the gate length $L_p$ of the P-channel MOS transistor is about the same as the gate length $L_n$ of the N-channel MOS transistor, in order to satisfy the condition that an input voltage and an output voltage are simultaneously equal to $V_{cc}/2$ where $V_{cc}$ is a power supply voltage, $$W_p:W_n=2:1 \tag{3}$$

where $W_p$ is the gate width of the P-channel MOS transistor and $W_n$ is the gate width of the N-channel MOS transistor.

When the relationship (3) is applied to a two-input NOR circuit as illustrated in FIG. 7, the relationship (3) is replaced by $$W_p:W_n=4:1 \tag{4}$$

In FIG. 7, the gate width of the transistors of the driver 4-Y is $$W_n + W_n + W_p = W + W + 4W = 6W \tag{5}$$

where $W_n=W$ and $W_p=4W$ (see relationship (4)).

On the other hand, in FIG. 7, since the P-channel transistor $Q_p1$ for transmitting the power supply voltage $V_{cc}$ to the word drive signal $E_X$ corresponds to P-channel MOS transistors of a series of two NOR circuits, the gate width of the P-channel transistor $Q_p1$ of FIG. 7 is $$4 \cdot W_p = 16\ W \tag{6}$$

Also, in FIG. 7, since the N-channel transistor $Q_n1$ corresponds to N-channel MOS transistors of a series of two NOR circuits, the gate width of the N-channel transistor $Q_n1$ of FIG. 7 is $$4 \cdot W_n = 4\ W \tag{7}$$

Further, in FIG. 7, since the N-channel transistor $Q_n2$ is used only for causing the word drive signal $E_x$ to be grounded, the gate width of the N-channel transistor $Q_n2$ of FIG. 7 is $$\tfrac{1}{2} W_n = 0.5\ W \tag{8}$$

Thus, from the formulae (5), (6), (7) and (8), if n=8 and m=16, the total gate width of the transistors of the column driver circuit 4 and the word driver circuit 6' of FIG. 5 is $$6\ W \times 8 + (16\ W + 4\ W + 0.5\ W) \times 16 = 376\ W \tag{9}$$

Therefore, in spite of the reduced number of transistors, since the size of the P-channel transistor $Q_p1$ of FIG. 7 is remarkably large, the integration of the column driver circuit 4 and the word driver circuit 6' cannot be reduced in size.

Figure 8:
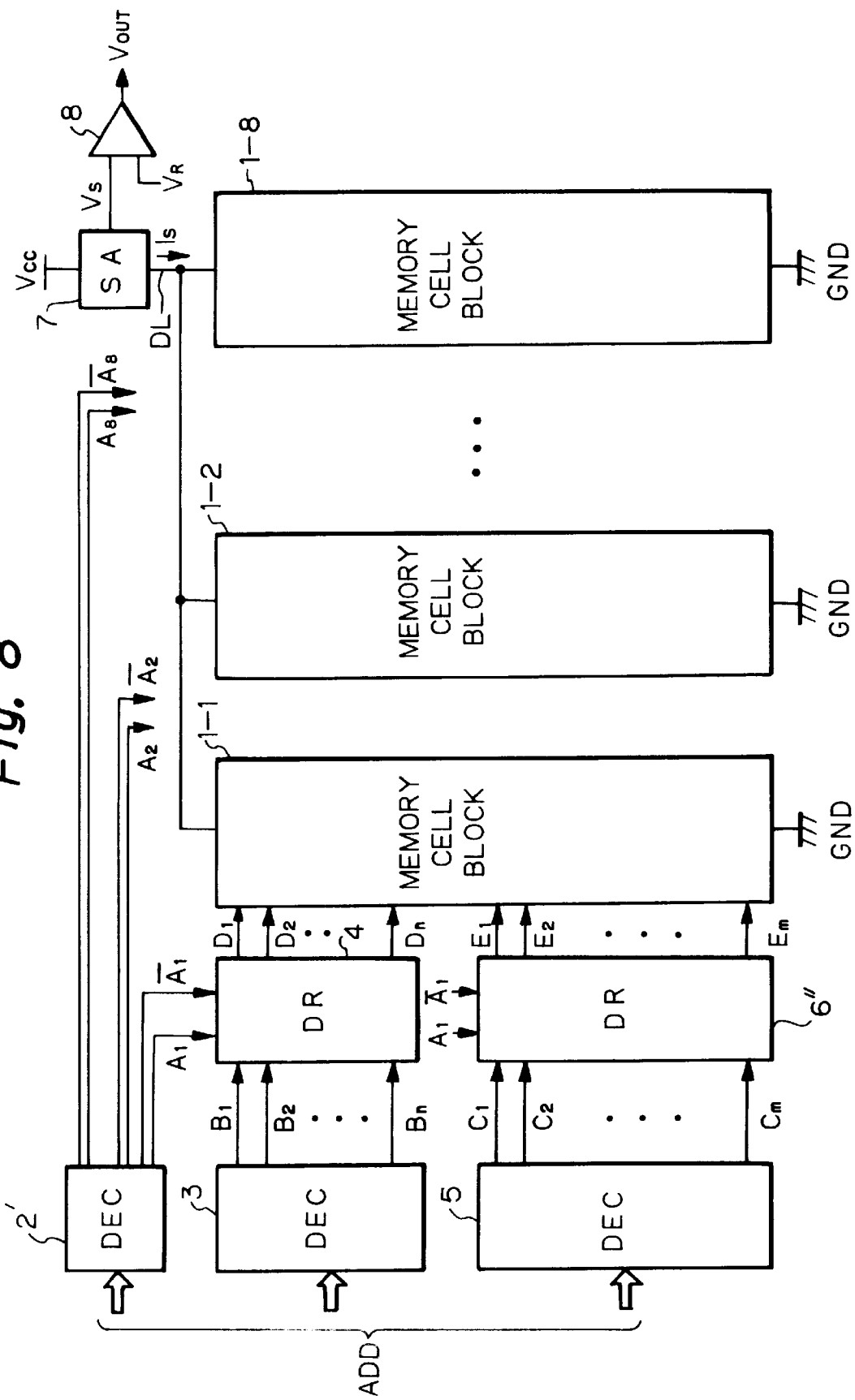
FIG. 8 is a block circuit diagram 11 illustrating an embodiment of the ROM type semiconductor memory device according to the present invention.

In FIG. 8, which illustrates an embodiment of the present invention, the block decoder 2 of FIG. 1 is modified into a block decoder 2' which also generates inverted signals $\overline{A_1}$, $\overline{A_2}$, ..., $\overline{A_8}$ of the block selection signals $A_1, A_2, \ldots, A_8$. The inverted signals $\overline{A_1}, \overline{A_2}, \ldots, \overline{A_8}$ as well as the block selection signals $A_1, A_2, \ldots, A_8$ are supplied to a word driver circuit 6".

Figure 9:
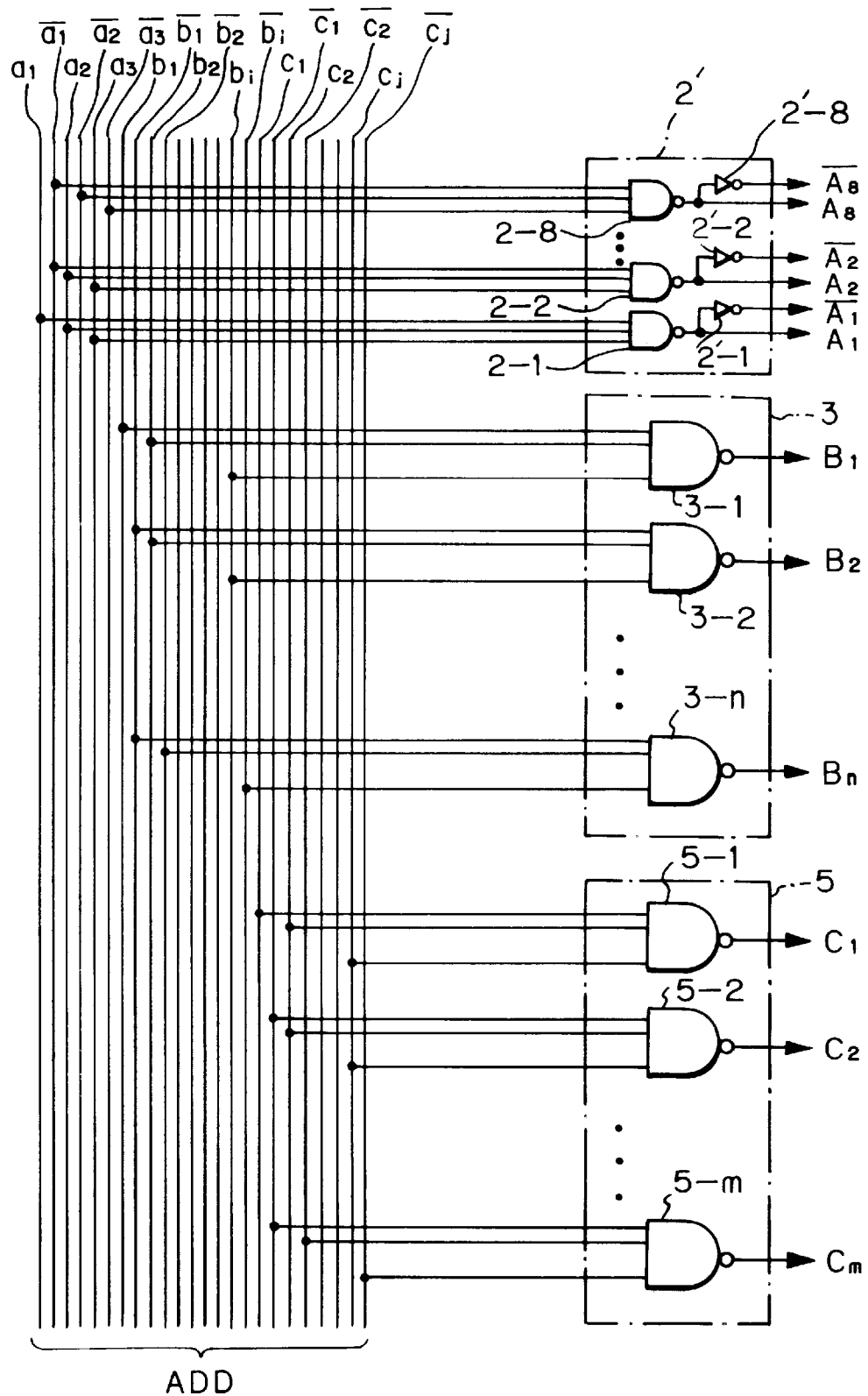
FIG. 9 is a detailed circuit diagram of the block decoder, the column decoder and the word decoder of FIG. 8.

As illustrated in FIG. 9, the block decoder 2' includes inverters 2'-1, 2'-2, ..., 2'-8 in addition to the NAND circuits 2-1, 2-2, ..., 2-8 of FIG. 1, so that the inverted signals $\overline{A_1}, \overline{A_2}, \ldots, \overline{A_8}$ are generated.

Figure 10:
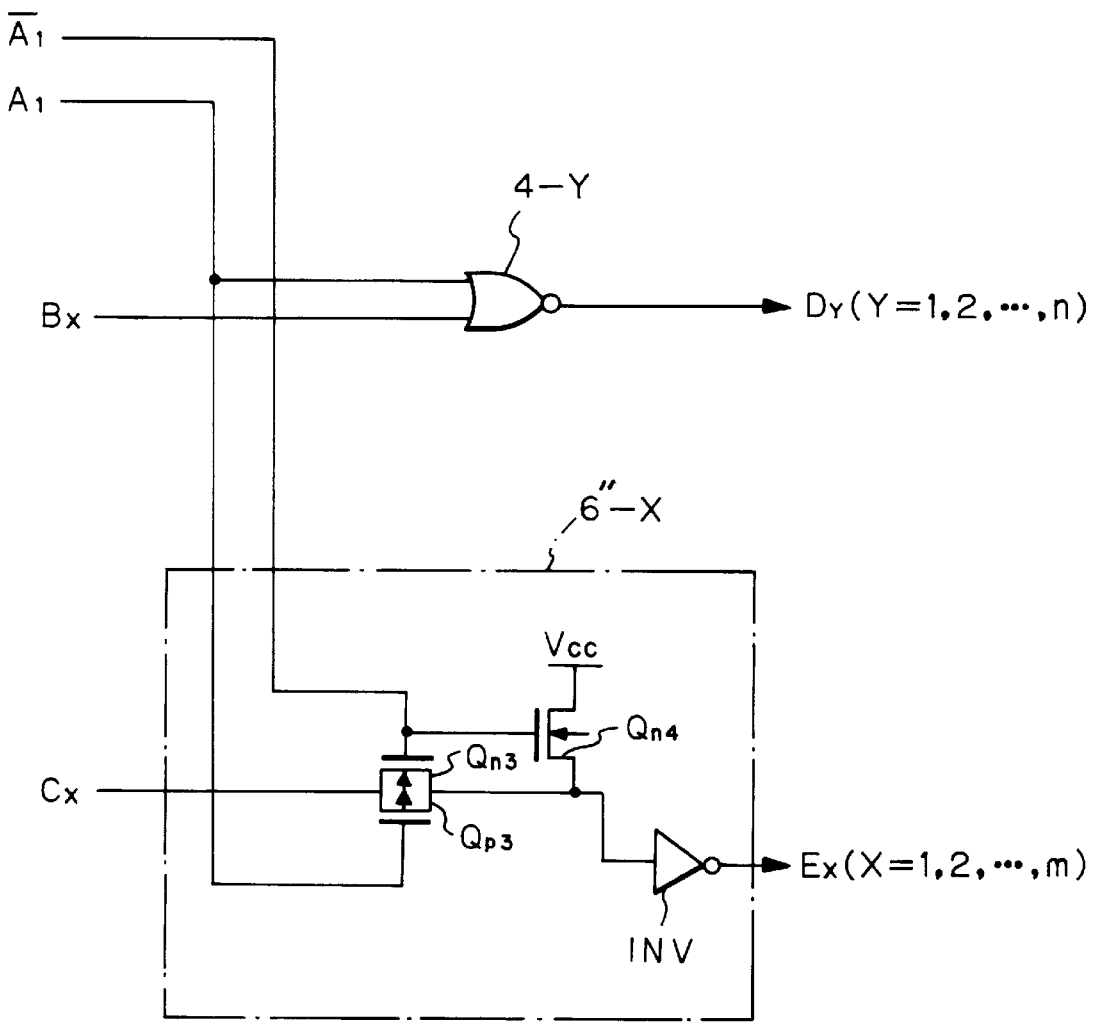
FIG. 10 is a detailed circuit diagram of the column driver circuit and the word driver circuit of FIG. 8.

As illustrated in FIG. 10, a driver 6"-X of the word driver circuit 6" includes N-channel MOS transistors $Q_n3$ and $Q_n4$ controlled by the inverted signal $\overline{A_1}$, a P-channel MOS transistor $Q_p3$ controlled by the block selection signal $A_1$, and an inverter INV formed by a series of a P-channel MOS transistor and an N-channel MOS transistor.

The transistors $Q_p3$ and $Q_n3$ form a transfer gate for passing the word selection signal $C_x$ therethrough. That is, when the block selection signal $A_1$ is low (active), the transfer gate is turned ON, so that the word selection signal $C_x$ passes through the transfer gate, so that the word selection signal $C_x$ is inverted by the inverter INV to obtain the word drive signal $E_x$. On the other hand, when the block selection signal $A_1$ is a high (inactive), the transfer gate is turned OFF, and simultaneously, the transistor $Q_n4$ is turned ON. As a result, the input voltage at the inverter INV is pulled up to $V_{cc}$, and accordingly, the output voltage of the inverter INV is pulled down to GND, so that the corresponding memory cells are surely in a non-selected state.

The layout of the column driver circuit 6" is discussed below.

Since the P-channel transistor $Q_p3$ and the N-channel transistor $Q_n3$ of FIG. 10 are used only for transmitting the word selection signal $C_x$ to the gates of the inverter INV, the gate width of the transistor $Q_n3$ of FIG. 10 is $$\tfrac{1}{2}W_n = 0.5 \text{ W} \quad (10)$$

Also, the gate width of the transistor $Q_p3$ of FIG. 10 is $$\tfrac{1}{2}W_p = W \quad (11)$$

Also, since the N-channel MOS transistor $Q_n4$ of FIG. 10 is used only for pulling up the gate voltage of the inverter INV, the gate width of the transistor $Q_n4$ is $$\tfrac{1}{4}W_p = 0.5 \text{ W} \quad (12)$$

Further, the total gate width of the P-channel and N-channel transistors of the inverter INV is $$(W_n + W_p) \times 4 = 12 \text{ W} \quad (13)$$

In the embodiment, although the inverters 2'-1, 2'-2, ..., 2'-8 of FIG. 9 are substantially increased in number as compared with the second prior art, the inverters 5'-1, 5'-2, ..., 5'-m are substantially decreased in number as compared with the second prior art. Therefore, if m=16, the total width 3W×(16−8)=24W is substantially decreased as compared with the second prior art.

Thus, from the formulae (5), (10), (11), (12) and (13), if n=8 and m=16, the total gate width of the transistors of the column driver circuit 4 and the word driver circuit 6" of FIG. 8 is $$6W \times 8 + (0.5W + 1W + 0.5W + 12W) \times 16 - 24W = 248W \quad (14)$$

Thus, in the embodiment, the total gate length of the transistors can be reduced as compared with the second prior art, thus enhancing the integration.

Figure 11:
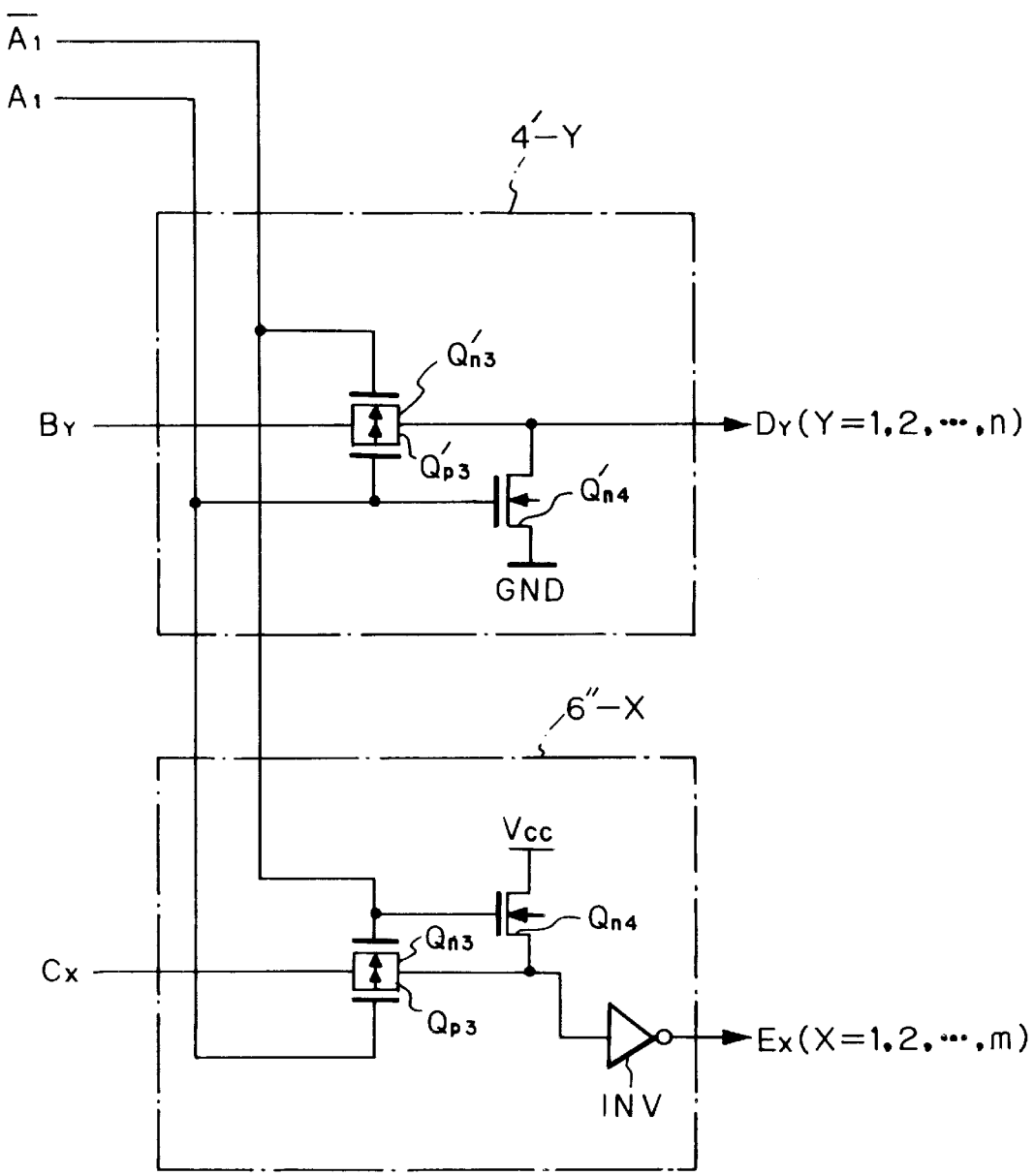
FIG. 11 is a circuit diagram of a modification of FIG. 10.

In FIG. 11, which is a modification of FIG. 10, a driver 4'-Y is provided instead of the driver 4-Y of FIG. 10. That is, the driver 4'-Y has a transfer gate formed by an N-channel MOS transistor $Q_n3'$, a P-channel MOS transistor $Q_p3'$, and an N-channel MOS transistor $Q_n4'$, for pulling down the voltage at the column drive signal $D_y$. That is, when the block selection signal $A_1$ is low (active), the transfer gate is turned ON, so that the column selection signal $B_y$ passes through the transfer gate, so that the column selection signal $B_y$ becomes the column drive signal $D_y$. On the other hand, when the block selection signal $A_1$ is high (inactive), the transfer gage is turned OFF, and simultaneously, the transistor $Q_n4'$ is turned ON. As a result, the input voltage at the inverter INV is pulled down to GND, so that the corresponding column selection transistors are surely in a non-selected state.

In FIG. 11, note that, when the column selection signal $B_y$ is high, the column selection signal $B_y$ is active. Therefore, inverters are provided at the output of the NAND circuits 3-1, 3-2, ..., 3-n of FIG. 9.

Also, in the embodiment using the modification of FIG. 11, although the inverters 2'-1, 2'-2, ..., 2'-8 of FIG. 9 and the inverters of the column decoder 3 are substantially increased in number as compared with the second prior art, the inverters 5'-1, 5'-2, ..., 5'-n are substantially decreased as compared in number with the second prior art. Therefore, the increase in the number of the inverters is compensated for.

In the embodiment using the modification of FIG. 11, the total gate width of the transistors corresponding to the formula (14) is represented by $$(1W + 2W + 1W) \times 8 + (0.5W + 1W + 0.5W + 12W) \times 16 = 258W \quad (15)$$

Thus, the total gate width of the transistors can be further reduced, thus enhancing the integration.

The present invention can be applied to an EPROM device or an EPROM device where binary data "0" or "1" is determined by introducing carriers into a floating gate. Also, the present invention can be applied to other mask ROM devices where binary data "0" or "1" corresponds to:

the presence of an enhancement type transistor or a depletion type transistor; and the low or high threshold voltage of a transistor.

As explained hereinabove, according to the present invention, since the layout of the driver circuits is reduced in size, the integration can be enhanced.

What is claimed is:

1. A semiconductor memory device having a plurality of memory cell blocks, each of the memory cell blocks including an array of columns and words of memory cells, said device comprising:

means for generating a memory cell block selection signal and one of a column and a word selection signal;

a driver circuit, connected to said selection signal generating means, for generating a drive signal for driving the memory cells, said driver circuit comprising a transfer gate, controlled by said memory cell block selection signal, for passing said one of a column and a word selection signal to generate said drive signal;

an inverter, connected between said transfer gate and the memory cells, for inverting said one of a column and a word selection signal passed through said transfer gate to generate said drive signal; and a switching element, connected between a power supply terminal and an input of said inverter and being controlled by said memory cell block selection signal.

2. A semiconductor memory device having memory cells, said device comprising:

a first decoder for generating a first selection signal and a second selection signal complementary to said first selection signal;

a second decoder for generating a third selection signal;

a third decoder for generating a fourth selection signal;

a first driver circuit, connected to said first and second decoders, for generating a first drive signal for driving said memory cells; and a second driver circuit, connected to said first and third decoders, for generating a second drive signal, said first driver circuit comprising:
a first transfer gate formed by a first P-channel MOS transistor and a first N-channel MOS transistor controlled by said first and second selection signals, respectively, to derive said first drive signal from said third selection signal; and
a second N-channel MOS transistor, connected between an output of said first transfer gate and a ground terminal and controlled by said first selection signal, said second driver circuit comprising:
a second transfer gate formed by a second P-channel MOS transistor and a third N-channel MOS transistor controlled by said first and second selection signals, respectively, to derive said second drive signal from said fourth selection signal;
an inverter, connected to said second transfer gate, for inverting said second drive signal; and
a fourth N-channel MOS transistor, connected between an output of said second transfer gate and a power supply terminal and controlled by said second selection signal.

3. A semiconductor memory device having memory cells, said device comprising:

a plurality of memory cell blocks, each including a plurality of memory cell columns each of said memory cell columns including a column switching transistor and a column of memory cells;

a block decoder for generating a plurality of pairs of complementary block selection signals for selecting one of said memory cell blocks;

a column decoder for generating column selection signals for selecting one memory cell column from each of said memory cell blocks;

a plurality of column drivers, connected to said block decoder and said column decoder, each column driver of said plurality of column drivers for receiving one pair of complementary block selection signals and one of said column selection signals to generate a column drive signal for driving said column switching transistor of one of said memory cell columns;

a word decoder for generating word selection signals for selecting one memory cell from each of said memory cell columns; and a plurality of word drivers, connected to said block decoder and said word decoder, each word driver of said plurality of word drivers for receiving one pair of complementary block selection signals and one of said word selection signals to generate a word drive signal for driving one memory cell of each of said memory cell columns, said each column driver of said plurality of column drivers comprising:
a first transfer gate connected to said block decoder and said column decoder, for receiving one of said column selection signals and deriving one of said column drive signals from said one of said column selection signals in accordance with one pair of said pairs of complementary block selection signals; and
a first switching transistor connected between an output of said first transfer gate and a ground terminal and being controlled by said one pair of said pairs of complementary block selection signals, said each word driver of said plurality of word drivers comprising:
a second transfer gate connected to said block decoder and said word decoder, for receiving one of said word selection signals and deriving one of said word drive signals in accordance with one pair of said pairs of complementary block selection signals;
a second switching transistor connected between an output of said second transfer gate and a power supply terminal and being controlled by the other of said one pair of said pairs of complementary block selection signals; and
an inverter, connected to the output of said second transfer gate, for inverting said one of said word selection signals passed through said second transfer gate.

* * * * *